(12) United States Patent
Ker et al.

(10) Patent No.: US 6,885,534 B2
(45) Date of Patent: Apr. 26, 2005

(54) ELECTROSTATIC DISCHARGE PROTECTION DEVICE FOR GIGA-HERTZ RADIO FREQUENCY INTEGRATED CIRCUITS WITH VARACTOR-LC TANKS

(75) Inventors: Ming-Dou Ker, Hsinchu (TW);
Cheng-Ming Lee, Taitung (TW);
Wen-Yu Lo, Taichung (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 220 days.

(21) Appl. No.: 10/277,640

(22) Filed: Oct. 21, 2002

(65) Prior Publication Data
US 2004/0075964 A1 Apr. 22, 2004

(51) Int. Cl.[7] .................................................. H02H 1/00
(52) U.S. Cl. ...................................................... 361/113
(58) Field of Search ...................... 361/113; 331/117 R; 327/553; 333/167; 455/197.2

(56) References Cited

U.S. PATENT DOCUMENTS

| | | | | |
|---|---|---|---|---|
| 5,493,715 A | * | 2/1996 | Humphreys et al. | ......... 455/264 |
| 5,708,394 A | * | 1/1998 | Karlquist | ..................... 331/1 R |
| 6,114,930 A | * | 9/2000 | Gobbi et al. | ................. 333/214 |
| 6,181,200 B1 | * | 1/2001 | Titizian et al. | ................. 330/66 |
| 6,194,976 B1 | * | 2/2001 | Cantey et al. | ............... 331/167 |
| 6,552,406 B1 | * | 4/2003 | Voldman | ..................... 257/473 |

* cited by examiner

Primary Examiner—Brian Sircus
Assistant Examiner—Zeev Kitov (57) ABSTRACT

The present invention relates to a device for protecting high frequency RF integrated circuits from ESD damage. The device comprises at least one varactor-LC circuit tank stacked to avoid the power gain loss by the parasitic capacitance of ESD circuit. The varactor-LC tank could be designed to resonate at the RF operating frequency to avoid the power gain loss from the parasitic capacitance of ESD circuit. Multiple LC-tanks could be stacked for further reduction in the power gain loss. A reverse-biased diode is used as the varactor for both purposes of impedance matching and effective ESD current discharging. Because the inductor is made of metal, both the inductor and the varactor can discharge ESD current when ESD condition happens. It has a high enough ESD level to prevent ESD discharge.

17 Claims, 12 Drawing Sheets

ELECTROSTATIC DISCHARGE PROTECTION DEVICE FOR GIGA-HERTZ RADIO FREQUENCY INTEGRATED CIRCUITS WITH VARACTOR-LC TANKS

FIELD OF THE INVENTION

This invention relates to the field of radio frequency integrated circuit (RFIC), and more particularly to an electrostatic discharge (ESD) protection for RFIC by employing varactor-LC tanks for ESD discharging.

BACKGROUND OF THE INVENTION

Electrostatic discharge (ESD) is a transient process of high-energy transfer from IC outside to inside when IC is floated. The entire discharge process takes about 100 ns for a human-body mode (HBM). In general, hundreds of volts, or even higher, are transferred during an ESD stress. Such a high voltage breaks down the gate oxide of the input stage and causes circuit malfunction. As the thickness of the gate oxide scales down continuously, it is important to provide a protection circuit or device to protect the gate oxide and to discharge ESD stress.

Figure 1:
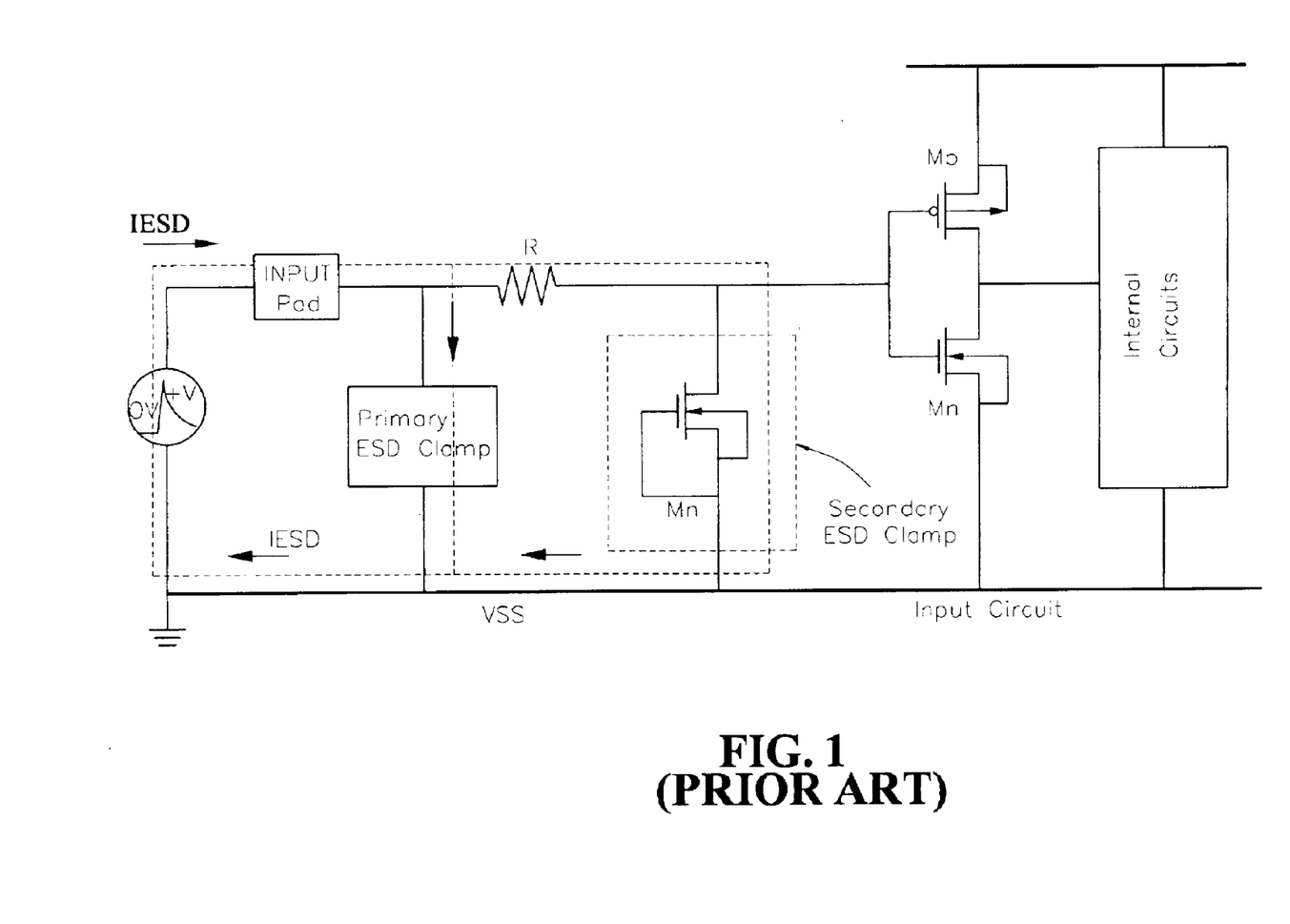
FIG. 1 shows a schematic diagram of a conventional two-staged ESD protection circuit.

A conventional ESD protection circuit, as shown in FIG. 1 of the attached drawings, is a two-staged protection structure for digital ICs comprising a primary stage and a secondary stage. Between the primary stage and the secondary stage of the ESD protection circuit, a resistor is added to limit an ESD current flowing through a short-channel NMOS of the secondary stage. The resistance of the resistor depends on both the turn-on voltage of an ESD clamp device of the primary stage and the breakdown current of the short-channel NMOS of the secondary stage. Such a two-staged ESD protection circuit provides high ESD level for digital input pins. However, the large series resistance and the large junction capacitance in the ESD clamp devices cause a long RC timing delay to the input signal, and hence, it is not suitable for analog pins, especially for the RF signal applications.

In high frequency applications, the parasitic capacitance of ESD protection device degrades the power gain performance of radio frequency (RF) circuits. Heretofore, the parasitic capacitance is reduced by reducing area of the ESD protection device. However, reducing area also degrades the ESD level. There is a continuous endeavor to reduce the impact of the parasitic capacitance of ESD clamp devices for the RF circuits.

Figure 2:
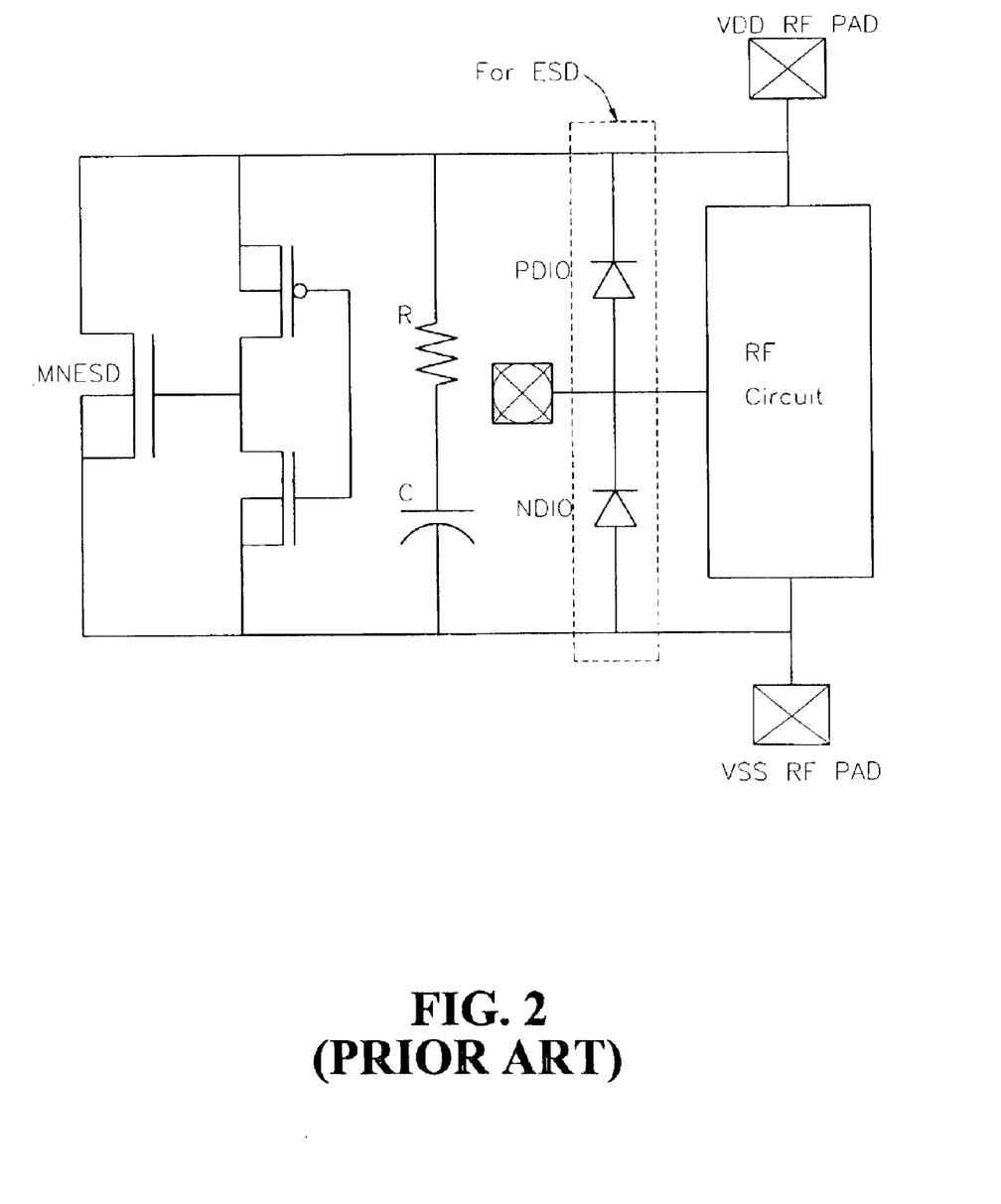
FIG. 2 shows a schematic diagram of a conventional ESD protection device comprising reverse-biased diodes and a Vdd-to-Vss power clamp circuit.

Several approaches are known to reducing parasitic capacitance while maintaining ESD level, including:

(1) Reverse-biased diodes with Vdd-to-Vss power clamp circuit: In this design, as shown in FIG. 2 of the attached drawings, a turn-on efficient ESD clamp circuit between the power rails is built into the ESD protection circuit to significantly increase the overall ESD level to compensate for the reduction of the ESD level caused by small area diodes.

(2) Inductor used as ESD device: Proposed by Leuven University, this design uses an LNA circuit with an inductor and Vdd-to-Vss dual stacked diodes to guard against ESD. An inductor is a low-pass passive device made of metal. Because the inductor connects the input to ground, it causes DC leakage from input directly to the ground. Therefore, a capacitor has to be used in series with the inductor to block input PAD and input gate. A problem with this design is that the inductor is used to protect the capacitor, instead of the input gate oxide.

Figure 3:
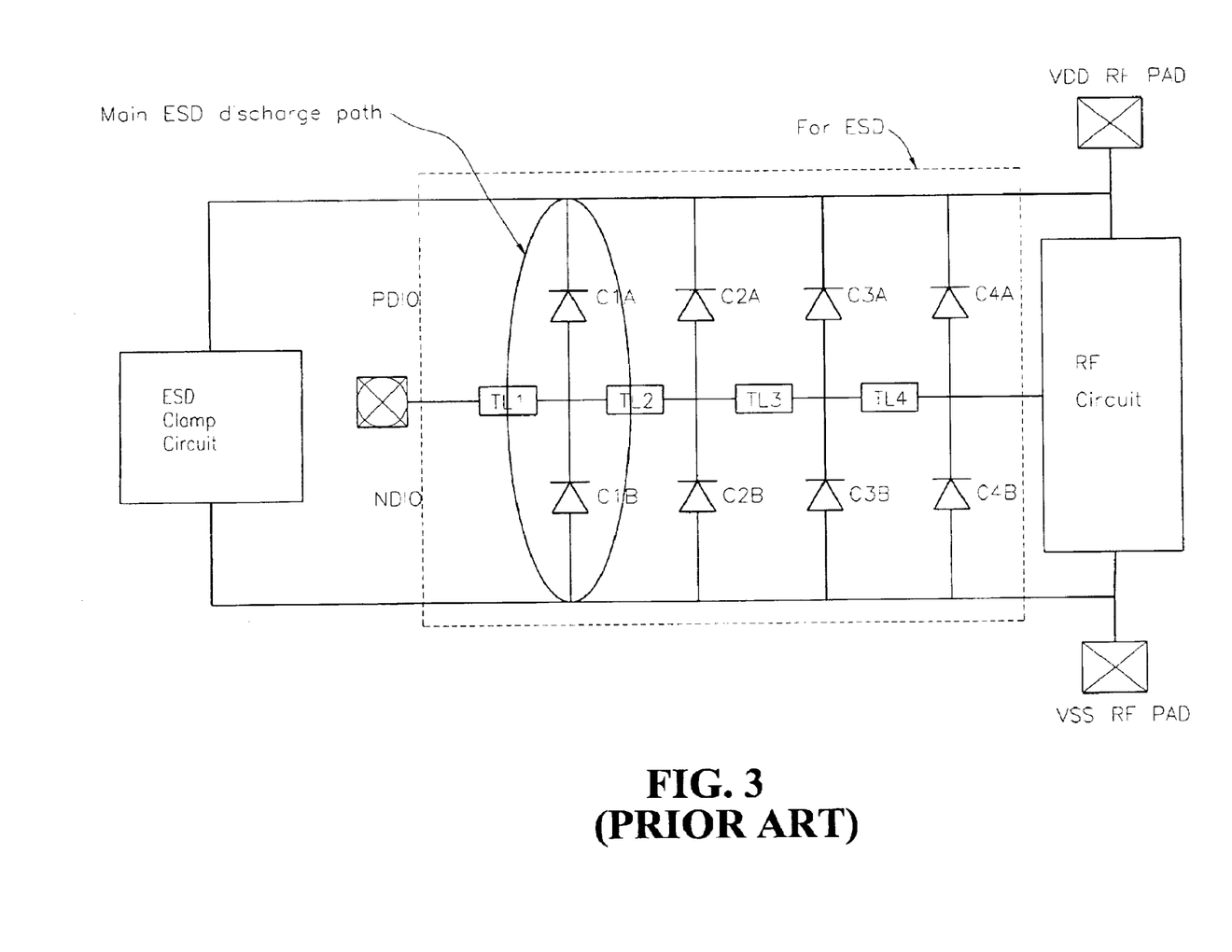
FIG. 3 shows a schematic diagram of a conventional distributed ESD protection device.

(3) Distributed ESD protection device for high speed IC: Initially proposed by Stanford University, the circuit shown in FIG. 3 of the attached drawings can be extended to a multiple of stages of matching structure. The more stages are used, the better the power gain is. However, as it is difficult to evenly distribute the ESD current to all the stages, the first stage is always the first to suffer the ESD damage before the rest, which, in turn, causes a low ESD level in practice.

Figure 4:
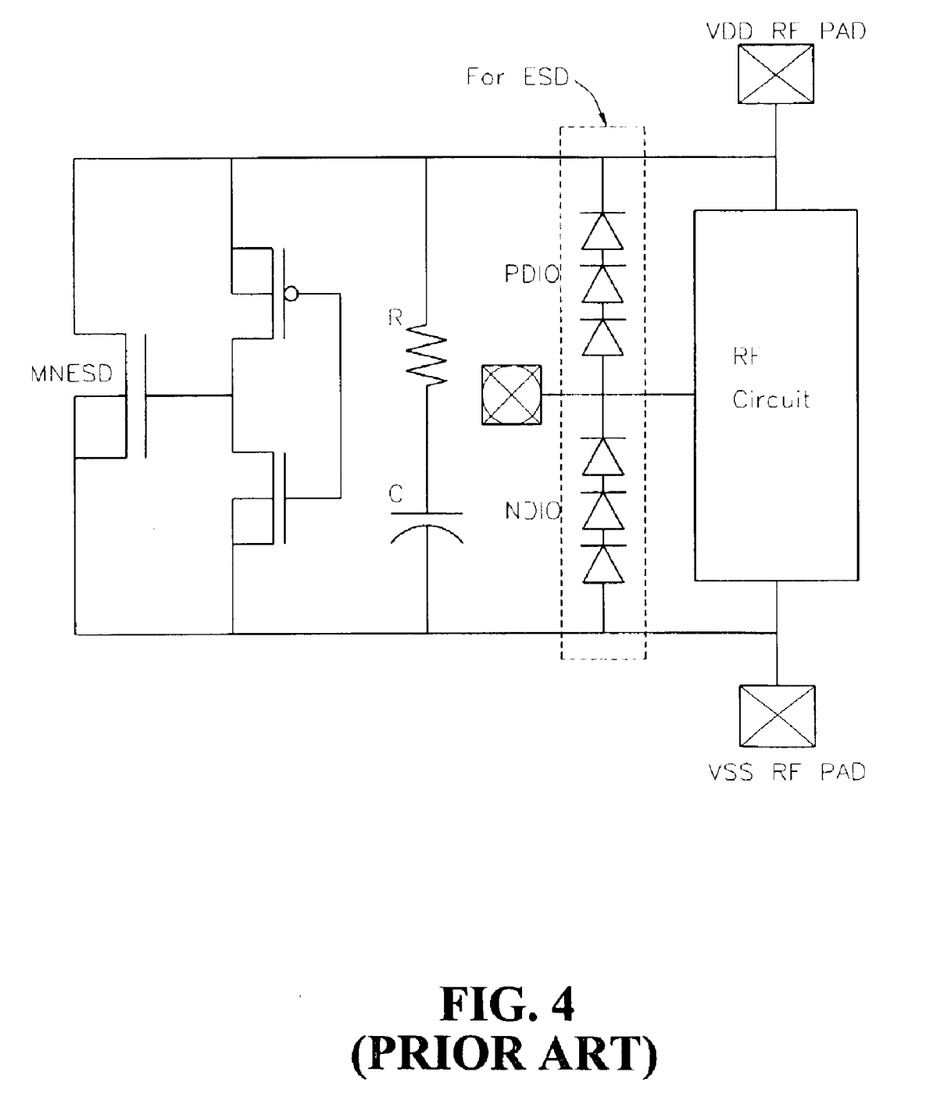
FIG. 4 shows a schematic diagram of a conventional ESD protection device comprising a stack of reverse-biased diodes and a Vdd-to-Vss power clamp circuit.

(4) Stacked reverse-biased diodes with Vdd-to-Vss power clamp circuit: The design, as shown in FIG. 4 of the attached drawings, employs a stack of series-connected reverse-biased diodes together with a Vdd-to-Vss power clamp circuit. Reports show that the ESD level of the stacked reverse-biased diodes does not degrade too much, while the parasitic capacitance of the ESD circuit is lowered.

Since the above ESD protection circuits have disadvantages in providing effective ESD protection to an RFIC, it is desirable to have an ESD protection circuit that overcomes the deficiencies of the conventional designs and provide an effective protection to an RFIC.

SUMMARY OF THE INVENTION

The present invention is to provide an ESD protection circuit for high frequency RFICs. The ESD protection circuit comprises at least a varactor-LC tank. Since the RFIC applications require small parasitic capacitance, the ESD device is maintained small in size while possesses a high ESD level. Example of the ESD device includes an STI diode and an SCR device. A reverse-biased diode is used as a varactor in this invention.

The capacitance of the varactor is the depletion capacitance of the reverse-biased diode, which can be controlled by adjusting the supplied voltage. The inductor can be implemented as an on-chip device. However, the state-of-the-art CMOS technology can only make on-chip inductor with low Q value. The other choice is to use high Q value inductors, such as a bond-wire inductor. Furthermore, as the values of the inductance and the capacitance of the LC-tank can be designed to resonate at the RF operating frequency, the signal will not be lost to the ground due to the infinite resistance seen by the signal from the input to the ground.

In an ESD condition, an ESD current flows through the inductor and the varactor of LC tank. The advantage of having multiple paths for the ESD current is to raise the ESD level. Because the inductor is a metal line with low parasitic resistance, the varactor-LC tank has a high ESD level due to the multiple paths for the ESD current.

The present invention will become more obvious from the following description when taken in connection with the accompanying drawings which show, for purposes of illustration only, preferred embodiments in accordance with the present invention. In the drawings:

DETAILED DESCRIPTION OF THE PREFERRED EMBODIMENTS

Figure 5:
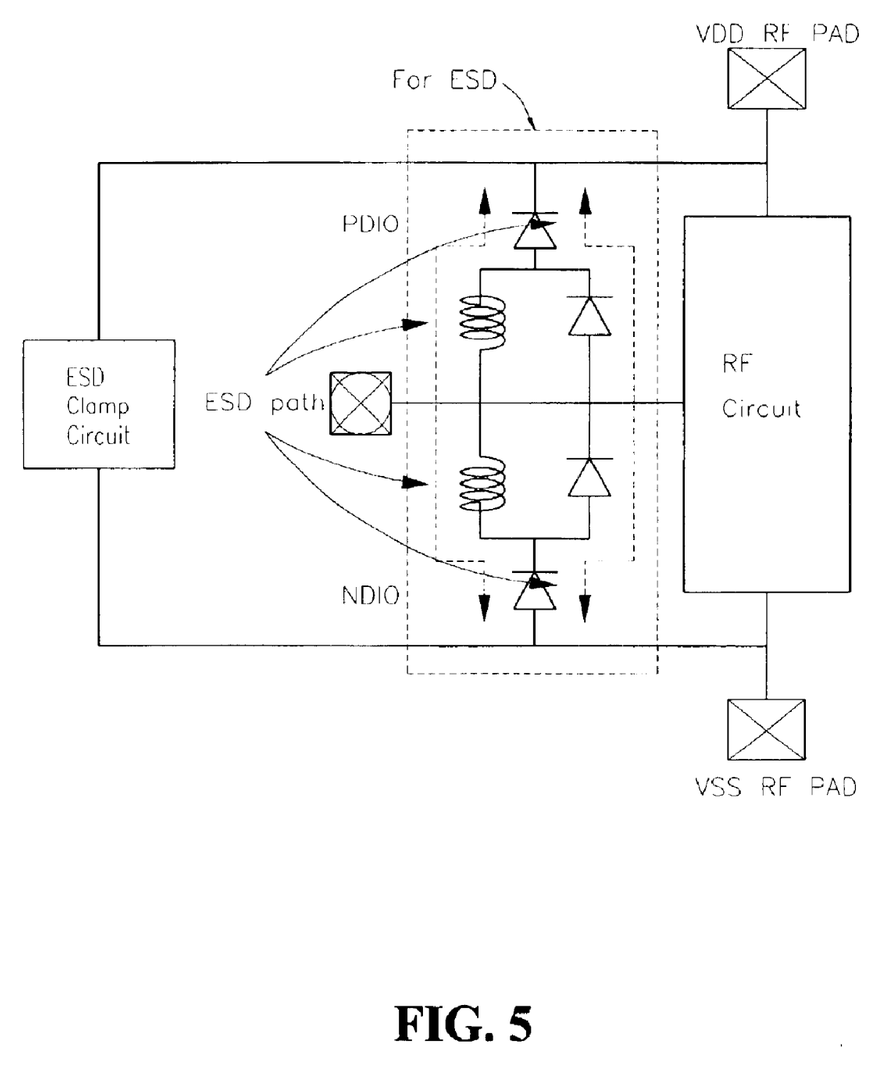
FIG. 5 shows an ESD protection circuit in accordance with a first embodiment of the invention.

With reference to the drawings and in particular to FIG. 5, an ESD protection device constructed in accordance with a first embodiment of the present invention comprises an ESD circuit arranged in an I/O port of a radio frequency integrated circuit (RFIC), and a secondary circuit comprised of a varactor-LC tank. Since the RFIC application requires a small parasitic capacitance, the ESD device is made small in size while possesses a high ESD level. Examples are an STI diode and an SCR device. In the illustrated embodiment, the varactor comprises a reverse-biased diode. However, other devices of the same electrical characteristics can be employed equally. The capacitance of the varactor is the depletion capacitance of the reverse-biased diode, which can be controlled by adjusting the supplied voltage. The inductor can be implemented as an on-chip device or alternatively, the inductor is embodied by a bond-wire inductor.

In the embodiment illustrated in FIG. 5, the secondary varactor-LC tank circuit is designed to resonate at the RF operating frequency to avoid power gain loss even when the impedance becomes infinite. The ESD current will flow through inductor L and ESD diode. To avoid the diodes operating in a breakdown condition, causing a much lower ESD level, a turn-on efficient Vdd-to-Vss clamp circuit between the power rails is built into the ESD protection device to significantly increase the ESD level. As can be seen in FIG. 5, the varactor-LC rank circuit is connected in series with a p-type diode (PDIO) and an n-type diode (NDIO). PDIO and NDIO are two spatially spaced ESD devices with one connected above and the other connected below the varactor-LC tank.

When the RF input pin is zapped in the NS-mode ESD stress, the NDIO diode is operating in the forward-biased condition with inductor to discharge ESD current. The diode operates in a forward-biased condition can sustain a much higher ESD level than in a reverse-biased condition. The Vdd-to-Vss ESD clamp circuit is turned on when the RF-input pad is zapped with the PS-mode or ND-mode ESD stress. Because the NDIO diode in the PS-mode ESD stress is not operating in a breakdown condition, the ESD current will flow through the forward-biased PDIO diode, and the turn-on Vdd-to-Vss ESD clamp circuit between the power rails. Similarly, the NDIO diode and inductor operate in the forward-biased condition with the Vdd-to-Vss ESD clamp circuit between power rails.

The Vdd-to-Vss ESD clamp circuit is designed with a larger dimension to sustain a high ESD level. Although the clamp circuit has a large junction capacitance, it does not contribute to the RF-pad. By using this ESD protection design, the RF-input pin can sustain much higher ESD levels in the four-mode ESD stress. Therefore, the loading capacitance generated from the PDIO and NDIO of the ESD protection device to the RF-input pad can be avoided by the varactor-LC tank. The performance of RF integrated circuit will not suffer at all.

Figure 6:
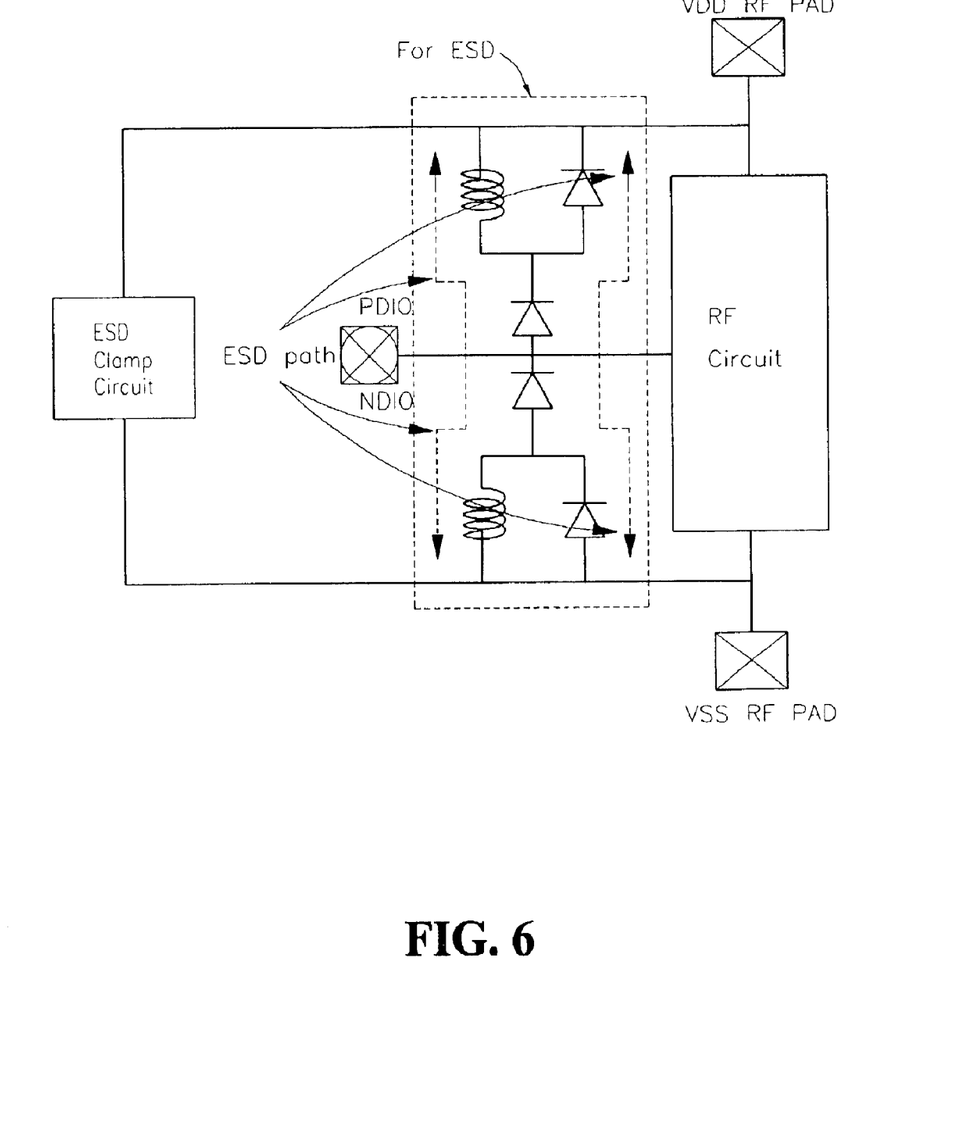
FIG. 6 shows an ESD protection circuit in accordance with a second embodiment of the invention.

FIG. 6 shows a modification of the arrangement of FIG. 5 by switching the position of the reverse-biased diode and the varactor-LC tank. The same ESD protection can be obtained with the modified embodiment shown in FIG. 6 as that of the embodiment of FIG. 5.

Figure 7:
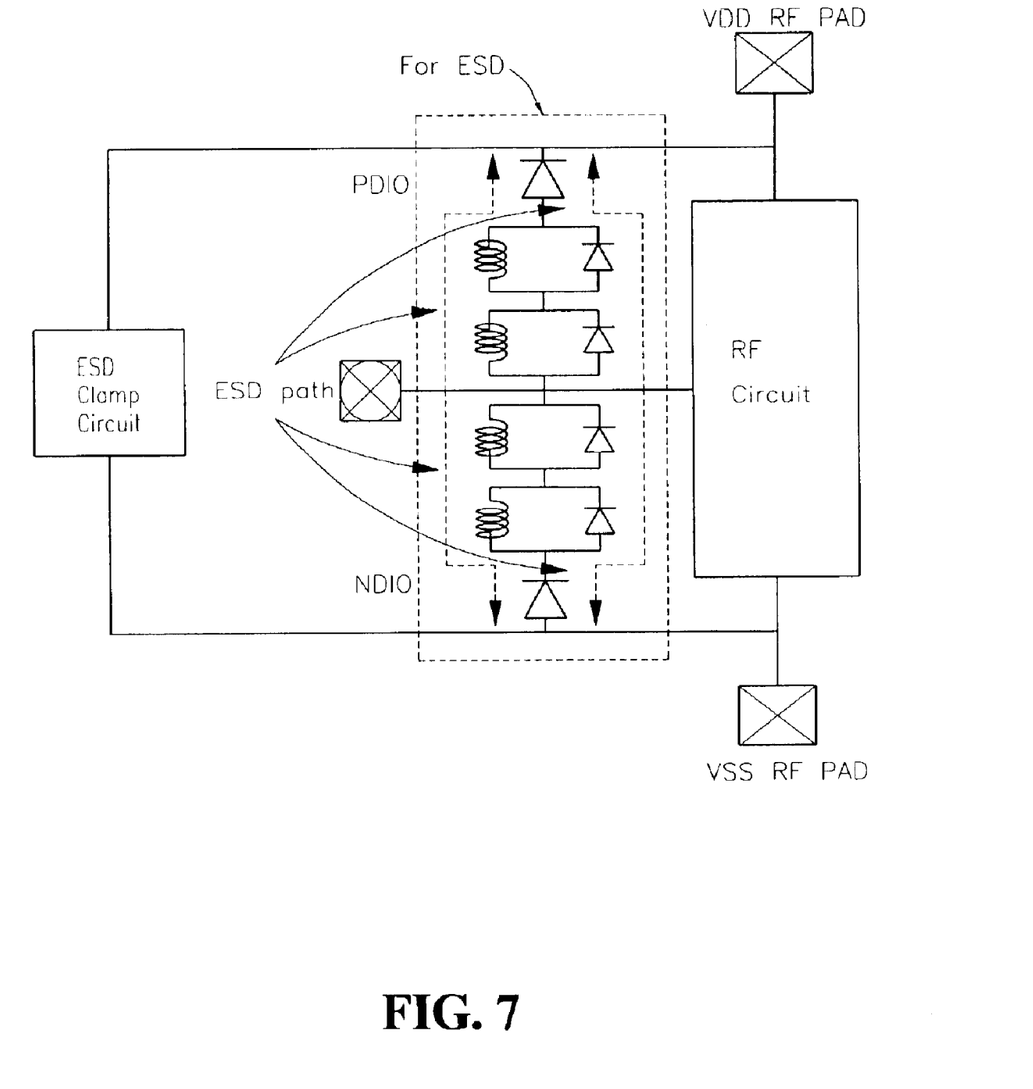
FIG. 7 shows an ESD protection device in accordance with a third embodiment of the invention.

FIG. 7 shows an ESD protection device in accordance with a third embodiment of the present invention in which two varactor-LC tanks are stacked with the diode to achieve higher impedance at resonance. The varactor-LC tank is designed to resonate at the RF operating frequency to avoid power gain loss even when the impedance becomes infinite. The ESD current will flow through inductor L and ESD diode. To avoid the diodes operating in a breakdown condition, and causing a much lower ESD level, a turn-on efficient Vdd-to-Vss clamp circuit between the power rails is built into the ESD protection circuit to significantly increase the ESD level.

When the RF input pin is zapped in the NS-mode ESD stress, the NDIO diode is operating in the forward-biased condition with inductor to discharge ESD current. The diode operates in a forward-biased condition can sustain a much higher ESD level than in a reverse-biased condition. The Vdd-to-Vss ESD clamp circuit is turned on when the RF-input pad is zapped with the PS-mode or ND-mode ESD stress. Because the NDIO diode in the PS-mode ESD stress is not operating in a breakdown condition, the ESD current will flow through the forward-biased PDIO diode, and the turn-on Vdd-to-Vss ESD clamp circuit between the power rails. Similarly, under the ND-mode ESD stress, the NDIO diode and inductor operate in the forward-biased condition with the Vdd-to-Vss ESD clamp circuit between power rails.

The Vdd-to-Vss ESD clamp circuit is designed with a larger dimension to sustain a high ESD level. Although the clamp circuit has a large junction capacitance, it does not contribute to the RF-pad. By using this ESD protection design, the RF-input pin can sustain much higher ESD levels in the four-mode ESD stress. Therefore, the loading capacitance generated from the PDIO and NDIO of the ESD protection device to the RF-input pad is avoided by the varactor-LC tank. The performance of RF integrated circuit will not suffer at all.

Figure 8:
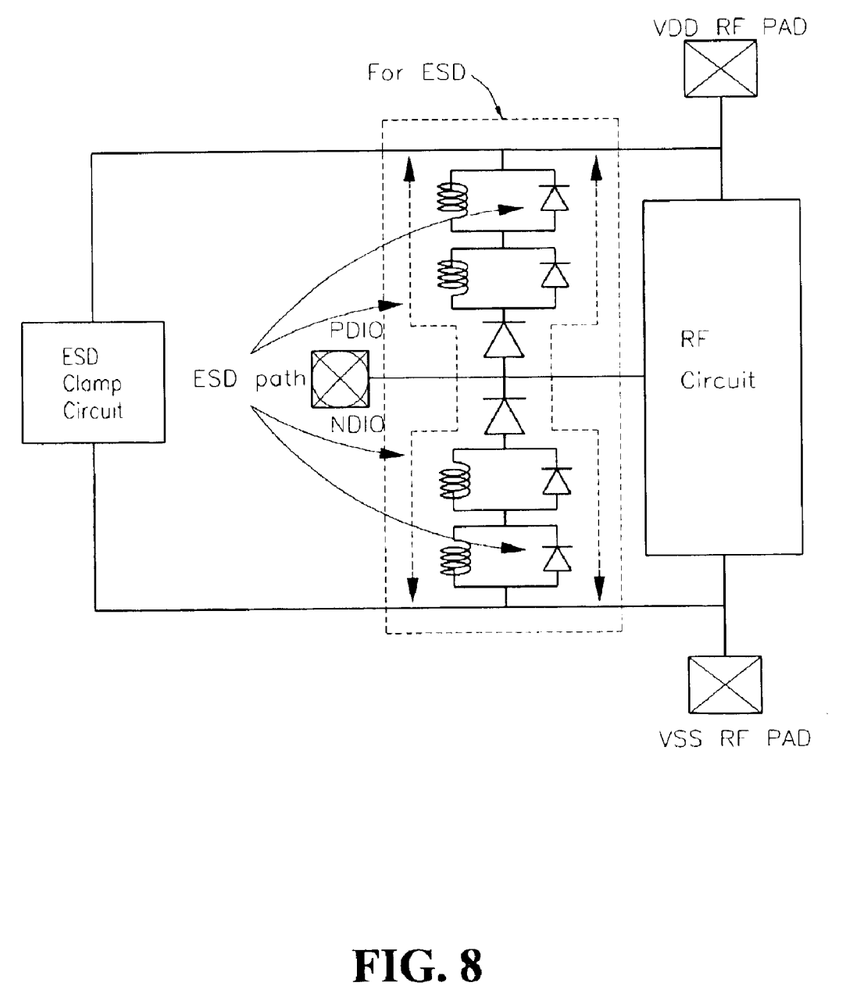
FIG. 8 shows an ESD protection device in accordance with a fourth embodiment of the invention.

FIG. 8 shows a modification of the arrangement shown in FIG. 7 by switching the position of the reverse-biased diodes and the varactor-LC tanks. The same protection can be obtained with the modified ESD protection device of FIG. 8.

Figure 9:
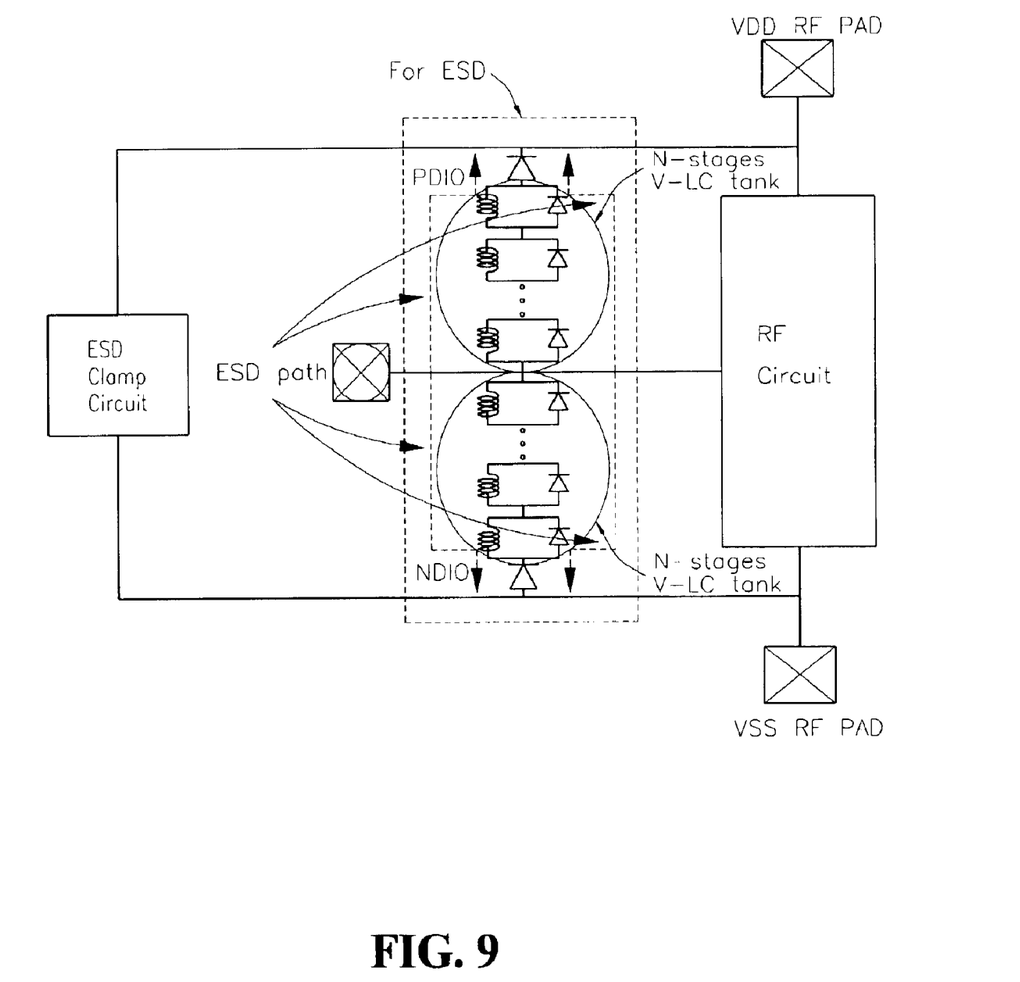
FIG. 9 shows an ESD protection device in accordance with a fifth embodiment of the invention.

FIG. 9 shows an ESD protection device in accordance with a fifth embodiment of the present invention in which a multiple of varactor-LC tanks are stacked with a diode.

Figure 10:
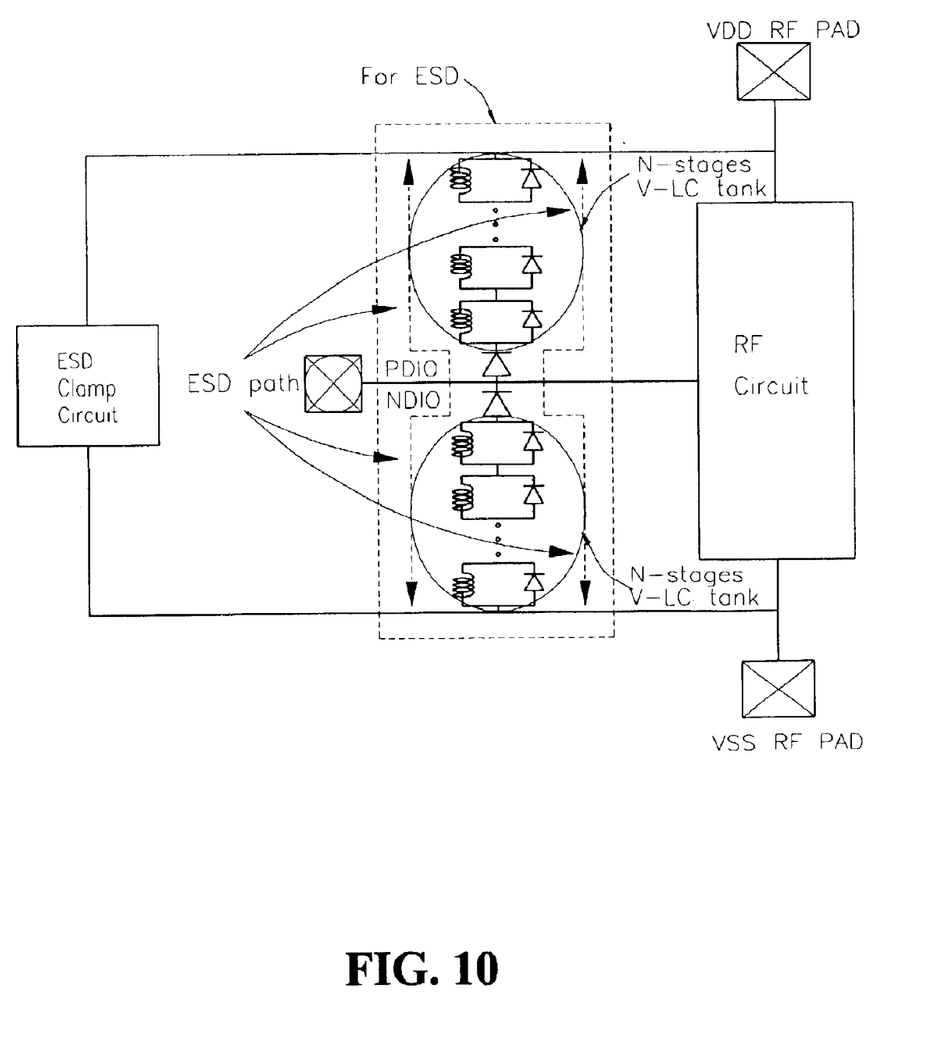
FIG. 10 shows an ESD protection device in accordance with a sixth embodiment of the invention.

FIG. 10 shows a modification of the arrangement shown in FIG. 9 by switching the position of the reverse-biased diode and the stacked varactor-LC tanks. The same protection can be obtained with the modified ESD protection device of FIG. 10.

Figure 11:
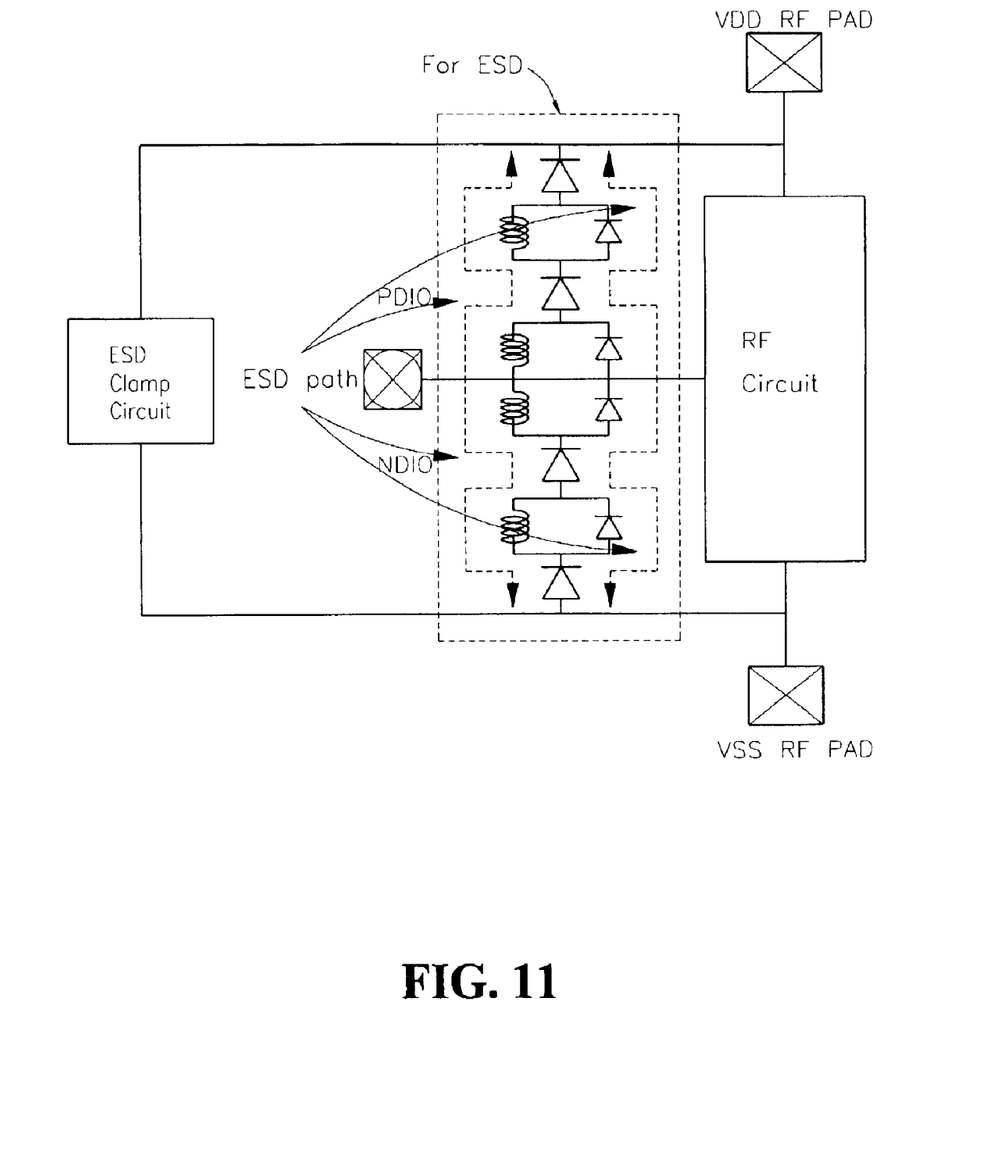
FIG. 11 shows an ESD protection device in accordance with a seventh embodiment of the invention.

FIG. 11 shows an ESD devices protection device in accordance with a seventh embodiment of the present invention in which a plurality of diode with varactor-LC tank pairs are employed for further reduction of parasitic capacitance and the power gain loss. The varactor-LC tank is designed to resonate at the RF operating frequency to avoid power gain loss even when the impedance becomes infinite. The ESD current flows through inductor L and ESD diode. To avoid the diodes operating in a breakdown condition, and causing a much lower ESD level, a turn-on efficient Vdd-to-Vss clamp circuit between the power rails is built into the ESD protection circuit to significantly increase the ESD level.

When the RF input pin is zapped in the NS-mode ESD stress, the NDIO diode is operating in the forward-biased condition with inductor to discharge ESD current. The diode operates in a forward-biased condition can sustain a much higher ESD level than in a reverse-biased condition. The Vdd-to-Vss ESD clamp circuit is turned on when the RF-input pad is zapped with the PS-mode or ND-mode ESD stress. Because the NDIO diode in the PS-mode ESD stress is not operating in a breakdown condition, the ESD current will flow through the forward-biased PDIO diode, and the turn-on Vdd-to-Vss ESD clamp circuit between the power rails. Similarly, during ND-mode ESD stress, the NDIO diode and inductor operate in the forward-biased condition with the Vdd-to-Vss ESD clamp circuit between power rails.

The Vdd-to-Vss ESD clamp circuit is designed with a larger dimension to sustain a high ESD level. Although the clamp circuit has a large junction capacitance, it does not contribute to the RF-pad. By using this ESD protection design, the RF-input pin can sustain much higher ESD levels in the four-mode ESD stress. Therefore, the loading capacitance generated from the PDIO and NDIO of the ESD protection device to the RF-input pad can be avoided by the varactor-LC tank. The performance of RF integrated circuit will not suffer at all.

Figure 12:
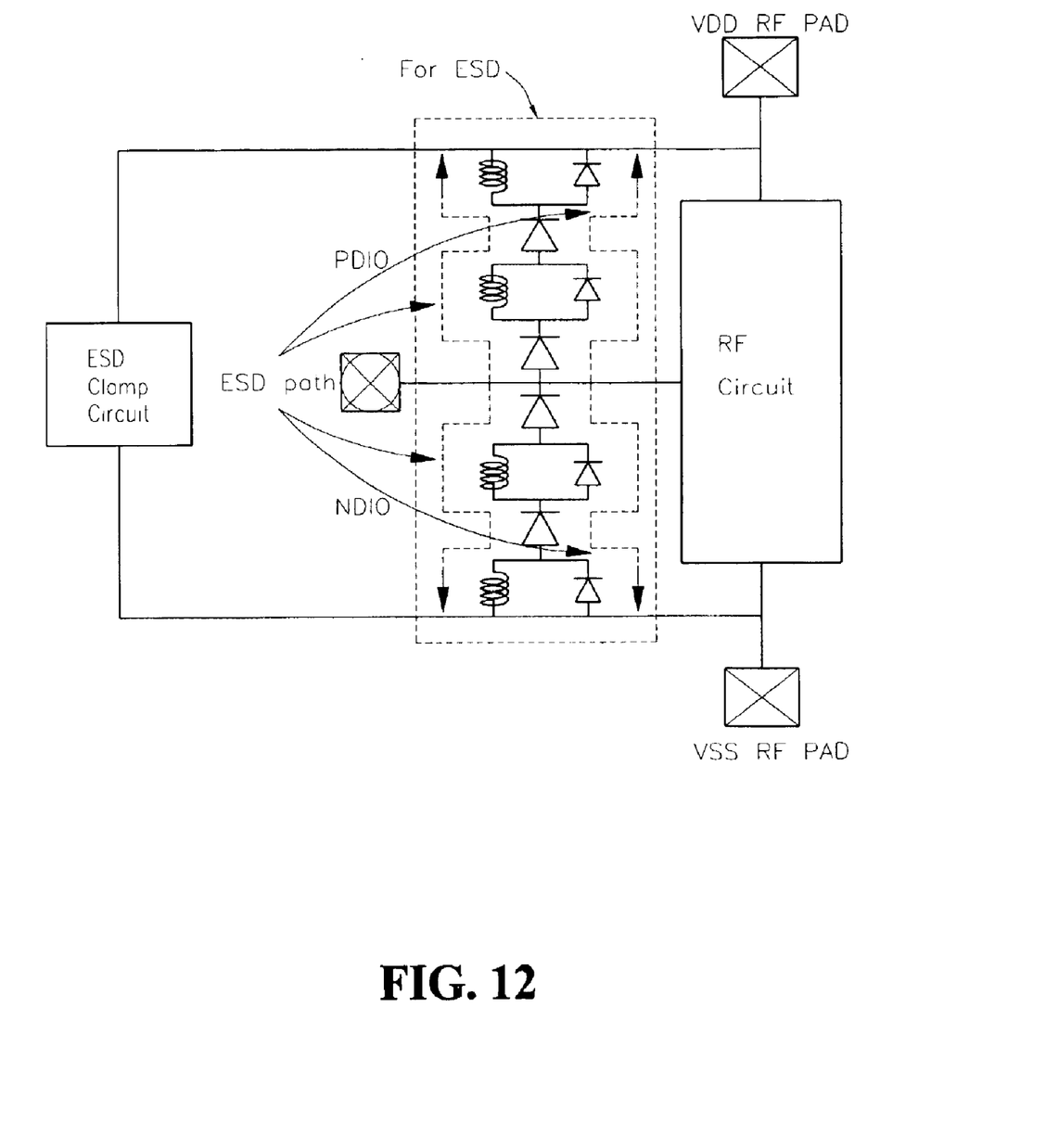
FIG. 12 shows an ESD protection device in accordance with an eighth embodiment of the invention.

FIG. 12 shows a modification of the arrangement shown in FIG. 11 by switching the position of the reverse-biased diode and the varactor-LC tank of each pair.

While we have shown and described the embodiments in accordance with the present invention, it should be clear to those skilled in the art that further embodiments may be made without departing from the scope of the present invention.

What is claimed is:

1. A device for protecting high frequency RFIC from ESD damage, comprising:
   at least an ESD device in an I/O port, and
   at least a varactor-LC tank connected in series with said ESD device.

2. The device as claimed in claim 1, wherein said varactor-LC tank comprises a varactor which is a reverse-biased diode.

3. The device as claimed in claim 1, wherein said varactor-LC tank comprises an inductor which is an on-chip inductor.

4. The device as claimed in claim 1, wherein said varactor-LC tank comprises an inductor which is a bond-wire inductor.

5. The device as claimed in claim 1, wherein said varactor-LC tank resonates at an operating frequency of said RFIC.

6. The device as claimed in claim 1, wherein a plurality of varactor-LC tanks is stacked in series with said ESD device.

7. The device as claimed in claim 1, wherein a plurality of ESD devices is spatially spaced, each being in series with a varactor-LC tank.

8. A device for protecting high frequency RFIC from ESD damage, comprising:
   a p-type diode;
   a first varactor-LC tank circuit connected in series to said p-type diode;
   a second varactor-LC tank circuit connected in series to said first varactor-LC tank circuit; and
   an n-type diode connected in series to said second varactor-LC tank circuit.

9. The device as claimed in claim 8, wherein said first varactor-LC tank circuit comprises at least a varactor-LC tank and said second varactor-LC tank circuit comprises at least a varactor-LC tank.

10. The device as claimed in claim 8, wherein said first varactor-LC tank circuit comprises a plurality of varactor-LC tanks and said second varactor-LC tank circuit comprises a plurality of varactor-LC tanks.

11. A device for protecting high frequency RFIC from ESD damage, comprising:
    a first varactor-LC tank circuit;
    a p-type diode connected in series to said first varactor-LC tank circuit;
    an n-type diode connected in series to said a p-type diode; and
    a second varactor-LC tank circuit connected in series to said n-type diode.

12. The device as claimed in claim 11, wherein said first varactor-LC tank circuit comprises at least a varactor-LC tank and said second varactor-LC tank circuit comprises at least a varactor-LC tank.

13. The device as claimed in claim 11, wherein said first varactor-LC tank circuit comprises a plurality of varactor-LC tanks and said second varactor-LC tank circuit comprises a plurality of varactor-LC tanks.

14. A device for protecting high frequency RFIC from ESD damage, comprising:
    a first ESD protection circuit having a plurality of p-type circuit segments connected in series, each p-type circuit segment comprising a varactor-LC tank connected in series to a p-type diode; and
    a second ESD protection circuit connected in series to said first ESD protection circuit, said second ESD protection circuit having a plurality of n-type circuit segments connected in series, each n-type circuit segment comprising an n-type diode connected in series to a varactor-LC tank.

15. The device as claimed in claim 1, wherein said ESD device includes a p-type diode.

16. The device as claimed in claim 1, wherein said ESD device includes an n-type diode.

17. The device as claimed in claim 1, wherein said varactor-LC tank includes an inductor connected in parallel with a varactor.

* * * * *